United States Patent
Lee et al.

(10) Patent No.: US 10,618,925 B2
(45) Date of Patent: Apr. 14, 2020

(54) TUNGSTEN PRECURSOR

(71) Applicant: MICROCHEM INC., Eumseong-gun, Chungcheongbuk-do (KR)

(72) Inventors: Sam Keun Lee, Daejeon (KR); Jong Taik Lee, Yongin-si (KR); Jun Young Lee, Chungcheongbuk-do (KR); Ho Seob Kim, Seoul (KR)

(73) Assignee: MICROCHEM INC., Eumseong-gun (KR)

( * ) Notice: Subject to any disclaimer, the term of this patent is extended or adjusted under 35 U.S.C. 154(b) by 36 days.

(21) Appl. No.: 15/746,222

(22) PCT Filed: Mar. 16, 2016

(86) PCT No.: PCT/KR2016/002675
§ 371 (c)(1),
(2) Date: Jan. 19, 2018

(87) PCT Pub. No.: WO2017/014399
PCT Pub. Date: Jan. 26, 2017

(65) Prior Publication Data
US 2018/0208617 A1    Jul. 26, 2018

(30) Foreign Application Priority Data

Jul. 20, 2015  (KR) .................... 10-2015-0102542

(51) Int. Cl.
| | | |
|---|---|---|
| C07F 11/00 | (2006.01) | |
| C23C 16/06 | (2006.01) | |
| C07F 17/00 | (2006.01) | |
| C23C 16/455 | (2006.01) | |
| C09D 1/00 | (2006.01) | |

(52) U.S. Cl.
CPC .............. *C07F 17/00* (2013.01); *C07F 11/00* (2013.01); *C09D 1/00* (2013.01); *C23C 16/06* (2013.01); *C23C 16/45525* (2013.01); *C23C 16/45553* (2013.01)

(58) Field of Classification Search
CPC . C07F 11/00; C07F 17/00; C09D 1/00; C23C 16/06; C23C 16/18
See application file for complete search history.

(56) References Cited

U.S. PATENT DOCUMENTS

| | | | | |
|---|---|---|---|---|
| 5,298,471 | A * | 3/1994 | Bell ................ | C08G 61/08 502/167 |
| 2007/0185290 | A1* | 8/2007 | Hayano ............ | C08G 61/06 526/172 |
| 2010/0159694 | A1* | 6/2010 | Chandrashekar ... | C23C 16/0281 438/660 |
| 2012/0029217 | A1* | 2/2012 | Nagato ............. | C07D 301/12 549/523 |
| 2014/0154883 | A1* | 6/2014 | Humayun ......... | H01L 21/67207 438/675 |
| 2014/0273452 | A1* | 9/2014 | Blomberg ......... | H01L 21/28562 438/680 |
| 2015/0251920 | A1* | 9/2015 | Li ..................... | C23C 16/18 427/250 |
| 2016/0032454 | A1* | 2/2016 | Gatineau .......... | C23C 16/18 427/576 |
| 2016/0122867 | A1* | 5/2016 | Han ................. | C07F 11/00 427/252 |
| 2016/0178804 | A1* | 6/2016 | Shen ................ | C01G 39/02 252/587 |
| 2018/0051129 | A1* | 2/2018 | Kato ................. | C08G 61/08 |

FOREIGN PATENT DOCUMENTS

| | | | | |
|---|---|---|---|---|
| CN | 1675402 A | | 9/2005 | |
| JP | 2-185520 | * | 7/1990 | ............. C08G 61/08 |
| KR | 10-2014-0127684 | | 11/2014 | |
| WO | 2008/002546 A1 | | 1/2008 | |
| WO | WO 2013-046155 A1 | * | 4/2013 | ............. C07F 11/00 |

OTHER PUBLICATIONS

Spencer, Liam P., et al., "Synthesis and reactivity of bis(imido) uranium(vi) cyclopentadienyl complexes". Chem. Commun., 2008, 4986-4988.*
Gonzalez-Gallardo, Sandra, et al., "Cyclopentadiene Based Low-Valent Group 13 Metal Compounds: Ligands in Coordination Chemistry and Link between Metal Rich Molecules and Intermetallic Materials". Chemical Reviews, 2012, 112, 3136-3170.*
Kubicki, Marek, et al., "Cyclopentadienyl complexes with transition metal-main group metal bonds". Can. J. Chem. vol. 65, 1987, pp. 1292-1297.*
Bonsu, Richard, et al., "Partially fluorinated oxo-alkoxide tungsten(vi) complexes as precursors for deposition of WOx nanomaterials". Dalton Transactions, 2014, 43, 9226-9233.*
Kubas, Gregory, "Preparation and Use of W(CO)3(NCR)3 (R=Et,Pr) as Improved Starting Materials for Syntheses of Tricarbonyl(n6-cyclopetatriene)tungsten and Other Substituted Carbonyl Complexes". Inorg. Chem. 1983, 22, 692-694.*
Green, Malcolm, et al., "New n-Cycloheptatrienyl Tungsten Compounds and the Intercalation of [M(n-C7H7)(n-C5H4Me)] (M=Mo or W) into ZrS2". J. Chem. Soc. Dalton Trans. 1993, pp. 3213-3217.*
Spencer, Liam, et al., "Synthesis and reactivity of bis(imido) uranium(vi) cyclopentadienyl complexes". Chem. Commun., 2008, 4968-4988.*
Evans, et al., "Synthesis of Heteroleptic Uranium (μ-η6: η6-C6H6)2—Sandwich Complexes via Facile Displacement of (η5-C5Me5)1— by Ligands of Lower Hapticity and Their Conversion to Heteroleptic Bis(imido) Compounds", J. Am. Chem. Soc. 2009, vol. 131, pp. 17473-17481.

(Continued)

*Primary Examiner* — Bret P Chen
(74) *Attorney, Agent, or Firm* — Vorys, Sater, Seymour & Pease LLP; Mih Suhn Koh

(57) ABSTRACT

Provided are a tungsten precursor compound to which a substituent is bonded so as to obtain thermal stability and a method of forming a tungsten-containing film using the precursor.

11 Claims, 3 Drawing Sheets

(56) References Cited

OTHER PUBLICATIONS

Spencer, et al., "Synthesis and reactivity of bis(imido) uranium(Vi) cyclopentadienyl complexes", Chem. Commun., 2008, pp. 4986-4988.pdf.
Radius et al., "Bis(cyclopentadienyl) Diimido Complexes of Molybdenum and Tungsten [Cp2M(NR)2] at the Limit of Pi-Bond Saturation", European Journal of Inorganic Chemistry, 2001, vol. 2001, No. 6, pp. 1617-1623.
Radius et al., "Diimido, Imido Oxo, Dioxo, and Imido Alkylidene Halfsandwich Compounds via Selective Hydrolysis and alpha-H Abstraction in Molybdenum(VI) and Tungsten(VI) Organyl Complexes", Zeitschrift fuer Anorganische und Allgemeine Chemie, 2004, vol. 630, No. 6, pp. 848-857. (English language Abstract).
Office Action dated Jan. 8, 2019, in corresponding JP Application No. 2018-523718, 3 pages.
Ogura et al., "W chemical-vapor deposition using (I-C3H7C5H4)2WH2", J. Vac. Sci. Tech., vol. 26, pp. 561-564, (2008).
Chinese Office Action for Application No. 201680042860.9, eleven pages, dated Sep. 17, 2019.

\* cited by examiner

TUNGSTEN PRECURSOR

BACKGROUND

Technical Field

The present invention relates to a novel precursor compound and a film deposition method using the same, as a tungsten precursor suitable for use in chemical vapor deposition or atomic layer deposition, which is a deposition process that can be used to form dielectric films in semiconductor devices as organic metals.

Background Art

Chemical vapor deposition (CVD) and atomic layer deposition (ALD) have been applied as techniques for the deposition of thin films for semiconductor devices because they can achieve conformal films (metals, oxides, nitrides, etc.) through fine tuning of parameters during the process. Since film growth is mainly controlled by the chemical reaction of metal-organic compounds (precursors), it is important to develop optimal precursors by predicting their properties and reaction processes. Thus, efficient precursors have been developed to achieve specific properties for certain types of films.

Precursors are molecules for CVD and ALD processes and some of their unique properties must be considered before using them. First, liquid form and/or sufficient vapor pressure are required to facilitate transport of gaseous precursors from the containing vessel into the reaction chamber. Second, long-term thermal stability is required in storage conditions and transport conditions, and gas phase thermal stability is also necessary to prevent impurities from entering the film. Third, strong reactivity to reactive gases, such as ammonia or oxygen, is required to readily convert precursors to the required film on a sample substrate. Another important requirement to be considered for the precursor in the precursor design phase is to remove impurities from the film from the ligand during the deposition process.

Tungsten is used in a variety of applications that are useful in fabricating nano-devices. Deposition of pure tungsten may be used to fill the holes ("contact holes") that make the junctions to the transistor source and drain, or to fill the bias between successive layers of metal. This approach is known as the "tungsten plug" process. With $WF_6$, due to the good nature of the deposited film, the utilization of tungsten can be diversified. However, it is necessary to provide an adhesion/barrier layer, for example Ti/TiN, in order to protect the underlying Si by infiltration with fluorine, or to ensure the adhesion of tungsten to silicon dioxide.

Tungsten-silicide can be used to increase the conductivity of the gate line on top of the polysilicon gate and thus increase the transistor speed. This method is widely used in DRAM fabrication. The gate at this time is a word line for the circuit. Although $WF_6$ and $SiH_4$ can be used, dichlorosilane ($SiCl_2H_2$) is more commonly used as a silicon source, because it allows higher deposition temperatures and thus results in lower fluorine concentrations in deposited films.

Tungsten nitride (WNx) is considered a good barrier to copper diffusion in microelectronic circuits. WNx can also be used for electrodes for thin-film capacitors and field-effect transistors.

$WF_6$ can be used to deposit pure tungsten films in CVD mode using $H_2$ at high temperatures because of the W6+ oxidation state of liquid and highly volatile (Applied Surface Science, 73, 1993, 51-57; Applied Surface Science, 78, 2, 1994, 123-132). $WF_6$ can also be used in CVD mode in combination with silane for the production of tungsten silicide films at low temperatures.(Y. Yamamoto et al. Proc. Int. Conf. on CVD-XIII (1996) 814;Surface Science 408 (1998) 190-194). However, $WF_6$ is limited by the high thermal budget required for the deposition of pure tungsten film or due to fluorine which causes etching of the underlying silicon surface.

$W(CO)_6$ can be used for the deposition of pure tungsten or tungsten nitride films in CVD mode due to WO oxidation state. But it was limited to mass production due to its high toxicity. (Kaplan et al., J. Electrochem. Soc. 1979, 117, 693; Sun et al Thin Solid Films 2001, 397, 109)

$W(CO)_2(1,3$-butadiene$)_2$ can be used in the CVD mode, but deposition of a tungsten carbide film is formed. (Jipa et al., Chemical Vapor Deposition 2010, 16 (7-9), 239)

However, the W6+ oxidation state in the biscyclopentadienyl tungsten precursor with the formula $W(RCp)_2H_2$ can be used in the CVD mode for the deposition of pure tungsten, but a high deposition temperature is required resulting in carbon contamination. (Zinn et al Adv Mater. 1992, 375; Spee et al Mat. Sci. Eng 1993 (B17) 108; Ogura et al J. of Vac. Sci. Tech. 2008, 26, 561)

U.S. Pat. No. 7,560,581 B2 discloses the use of bis-alkylimido bis-dialkylamino tungsten precursors for the production of tungsten nitride in ALD mode with or without copper barrier diffusion applications.

Several diazabutadiene molecules have been developed apart from the tungsten precursor mentioned above. Diazabutadiene (DAD) ligands are diamine ligands that can be used under different oxidation states.

U.S. Pat. No. 7,754,908 to Reuter et al. discloses the use of bis-alkylimido diazabutadiene tungsten precursors for the production of tungsten-containing films. However, the use of an alkyl imido group has the disadvantage that introduction of carbon into the resulting film is possible. The tungsten molecule may contain several kinds of ligands other than homologous ligands. Therefore, their synthesis takes place in several stages, and the complexity, difficulty, and the like of the synthesis eventually lead to an increase in cost.

WO2012/027357 of Winter discloses a method of forming a thin film on a substrate comprising step of contacting the surface with a precursor compound having a transition metal and at least one alkyl-1,3-diazabutadiene ligand.

The deposition of a tungsten-containing film (pure tungsten, tungsten nitride or tungsten silicide) in the CVD or ALD mode can be problematic due to high C, O or F content in the film. Thus, a tungsten-containing precursor suitable for CVD or ALD deposition processes is needed. Preferred properties of tungsten-containing precursors for these applications are: i) liquid form or low melting point solids; ii) high volatility; iii) thermal stability to avoid degradation during handling and transportation; and iv) appropriate reactivity during the CVD/ALD process; and v) a pure tungsten film should be deposited in CVD or ALD (thermal or plasma mode) at a temperature of less than 200, preferably less than 150, and the thermal stability should not be too high to permit deposition at low temperatures.

Prior Art Document (Patent document 1) KR10-2012-0059440 A
(Patent document 2) KR10-2008-93393 A
(Patent document 3) KR10-2014-0127684 A

DETAILED DESCRIPTION OF THE INVENTION

Summary

The present invention provides a novel tungsten precursor compound as a precursor for depositing a tungsten thin film under chemical vapor deposition or atomic layer deposition process conditions and provides a tungsten deposition method using the same.

Technical Solution

The present invention provides a tungsten (W) precursor compound represented by the following Formula (1).

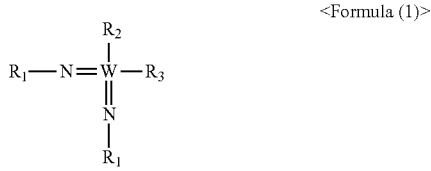

<Formula (1)>

(In Formula (1), $R_1$ is selected from the group consisting of $C_1$-$C_6$ alkyl; $C_1$-$C_6$ fluoroalkyl; and OR", $R_2$ is cycloheptatriene substituted with R' or cyclopentadien substituted with R', $R_3$ is cyclopentadien substituted with halogen or R', R' is selected from the group consisting of R"; OR"; NR"$_2$; SiR"$_3$; and PR"$_2$, and R" is selected from the group consisting of H; $CH_3$; $C_2H_5$; $C_3H_7$; i-$C_3H_7$; n-$C_4H_9$; and t-$C_4H_9$.)

According to a specific example of the present invention, the compound represented by Formula (1) provides the tungsten precursor compound represented by the following Formulas (2) to (4).

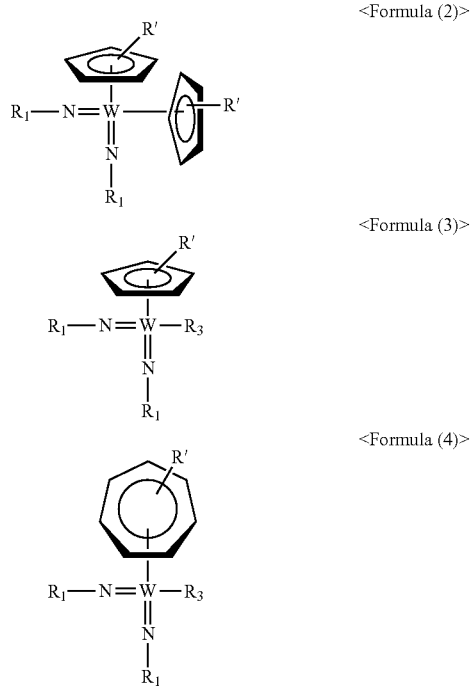

<Formula (2)>

<Formula (3)>

<Formula (4)>

(In Formula (2), $R_1$, $R_3$ and R are the same as defined in Formula (1).)

In another aspect, the present invention provides a method for forming a tungsten thin film using the tungsten precursor represented by Formula (1). The thin film process is preferably performed by chemical vapor deposition (CVD) or atomic layer deposition (ALD).

Effects of the Invention

The tungsten precursor represented by Formula 1 of the present invention is a novel compound having improved thermal stability and volatility, and is easy to synthesize, has high productivity, and has excellent safety in storage and transportation and can easily deposit a high-quality tungsten film using the same.

BRIEF DESCRIPTION OF THE DRAWINGS p

DETAILED DESCRIPTION

Figure 1:
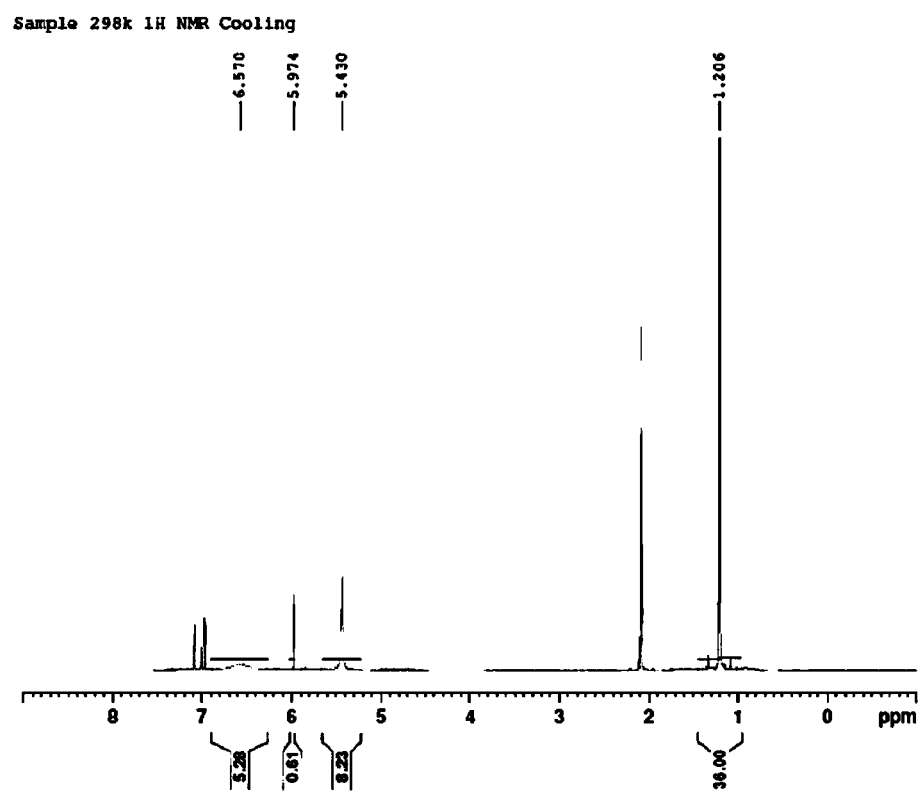
FIG. 1 shows the $^1$H NMR analysis data of bis-cyclopentadienyl-bis-(t-butylimido) tungsten (VI).
Figure 2:
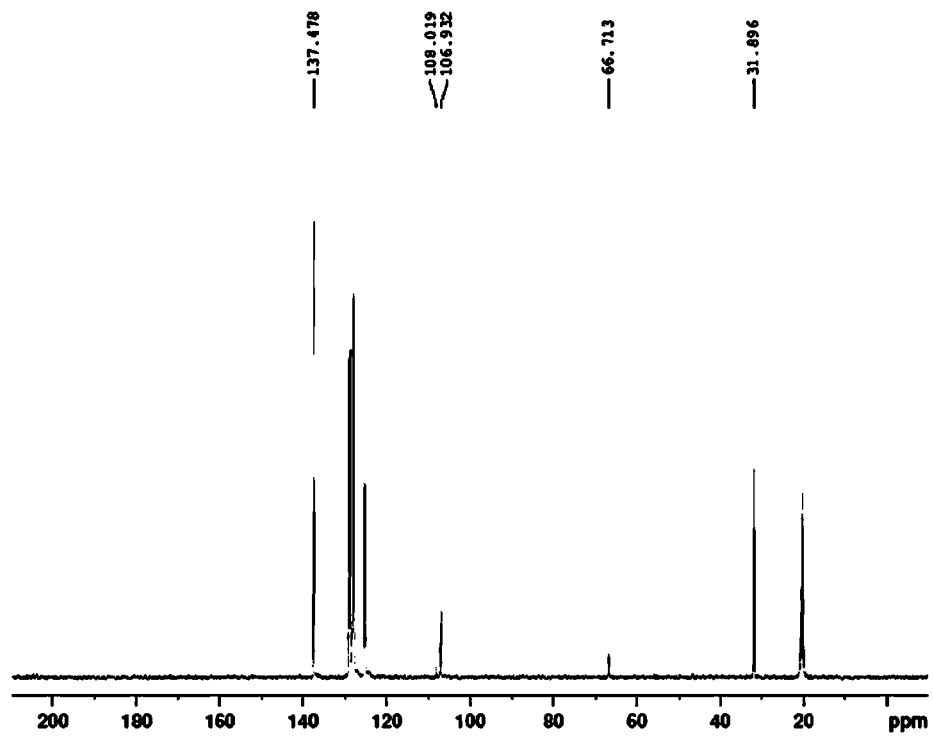
FIG. 2 shows $^{13}$C NMR analysis data of bis-cyclopentadienyl-bis-(t-butylimido) tungsten (VI).
Figure 3:
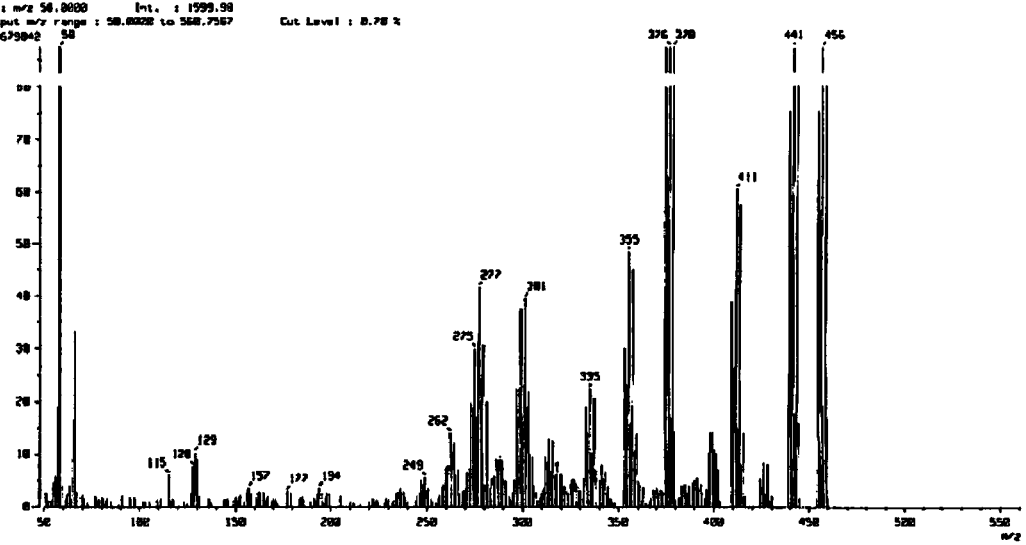
FIG. 3 is a graph showing HR-MS analysis data of bis-cyclopentadienyl-bis-(t-butylimido) tungsten (VI).
Figure 4:
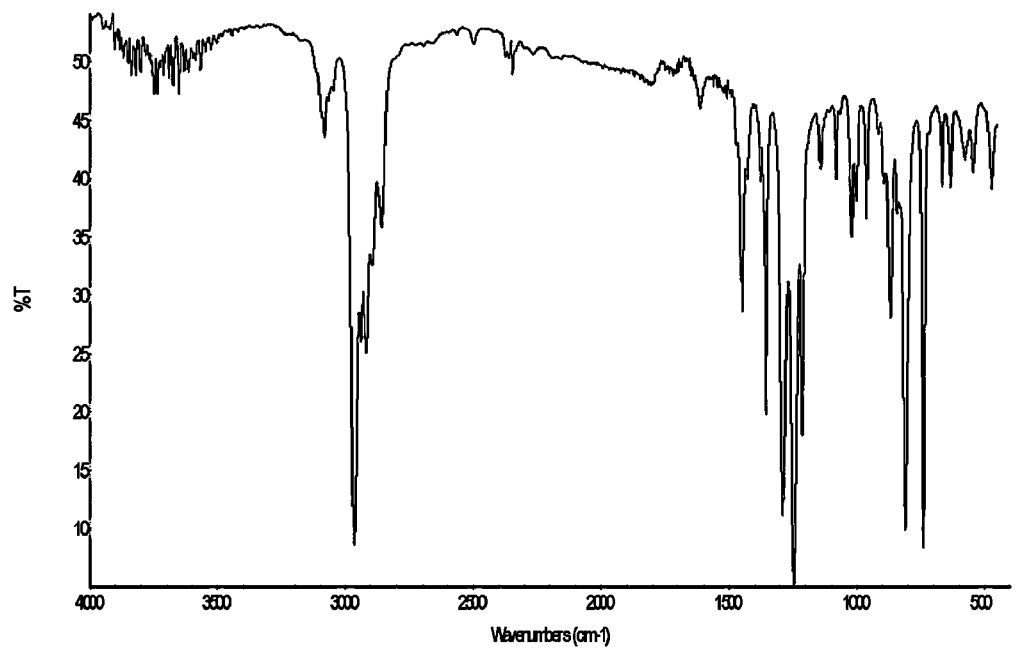
FIG. 4 shows IR analysis data of bis-cyclopentadienyl-bis-(t-butylimido) tungsten (VI).
Figure 5:
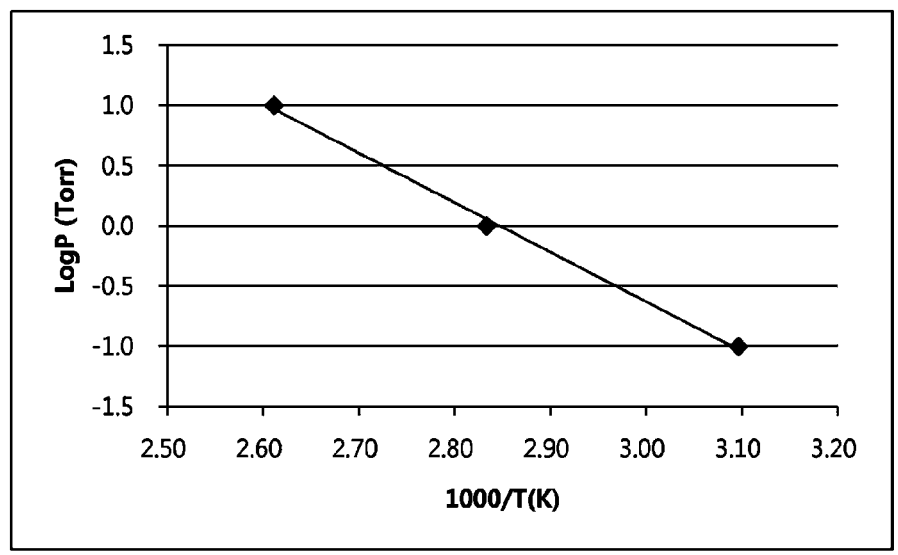
FIG. 5 shows data obtained by measuring the vapor pressure of bis-cyclopentadienyl-bis (t-butylimido) tungsten (VI).

Hereinafter, some embodiments of the present invention will be described in detail. In the following description of the present invention, a detailed description of known functions and configurations incorporated herein will be omitted when it may make the subject matter of the present invention rather unclear.

The present invention relates to a tungsten precursor compound represented by Formula (1).

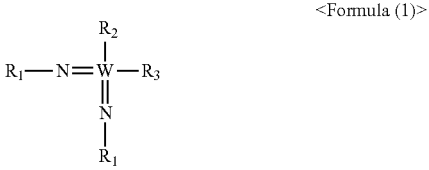

<Formula (1)>

(In Formula (1), $R_1$ is selected from the group consisting of $C_1$-$C_6$ alkyl, $C_1$-$C_6$ fluoroalkyl and OR", $R_2$ is cycloheptatriene substituted with R' or cyclopentadien substituted with R', $R_3$ is cyclopentadien substituted with halogen or R', R' is selected from the group consisting of R"; OR"; NR"$_2$; SiR"$_3$; and PR"$_2$, and R" is selected from the group consisting of H; $CH_3$; $C_2H_5$; $C_3H_7$; i-$C_3H_7$; n-$C_4H_9$; and t-$C_4H_9$.)

Among the compounds represented by Formula (1), compounds represented by the following Formulas (3) to (4) are particularly preferred.

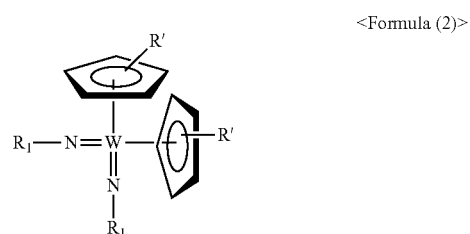

<Formula (2)>

-continued

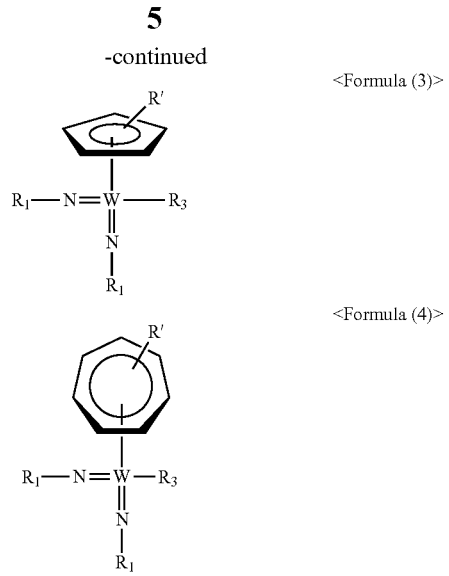

<Formula (3)>

<Formula (4)>

In Formula (2), $R_1$ is selected from $C_1$-$C_6$ alkyl, $C_1$-$C_6$ fluoroalkyl or OR", preferably a $C_1$-$C_4$ alkyl group, a $C_1$-$C_4$ fluoroalkyl group, and most preferably selected from $CH_3$, $C_2H_5$, $C_3H_7$, i-$C_3H_7$, n-$C_4H_9$ and t-$C_4H_9$. R' is selected from R", OR", NR"$_2$, SiR"$_3$, PR"$_2$, preferably selected from the group consisting of H, $CH_3$, $C_2H_5$, $C_3H_7$, i-$C_3H_7$, $C_4H_9$, t-$C_4H_9$, N$(CH_3)_2$, N$(C_2H_5)_2$, N$(CH_3)(C_2H_5)$, N$(CH_3)$ $(C_3H_7)$, N$(C_3H_7)_2$, N(i-$C_3H_7)_2$, N$(CH_3)$(i-$C_3H_7)$, N$(CH_3)$ (n-$C_4H_9)$, N(n-$C_4H_9)_2$, N(t-$C_4H_9)_2$, N$(CH_3)$(t-$C_4H_9)$, N$(C_2H_5)(C_3H_7)$, N$(C_2H_5)$(i-$C_3H_7)$, N$(C_2H_5)$(n-$C_4H_9)$, N$(C_2H_5)$(t-$C_4H_9)$, N$(C_3H_7)$(i-$C_3H_7)$, N$(C_3H_7)$(n-$C_4H_9)$, N$(C_3H_7)$(t-$C_4H_9)$, N(n-$C_4H_9)$(t-$C_4H_9)$, Si$(CH_3)_3$, Si$(C_2H_5)_3$, Si$(C_3H_7)_3$, Si(i-$C_3H_7)_3$, Si(n-$C_4H_9)_3$, Si(t-$C_4H_9)_3$, P$(CH_3)_2$, P$(C_2H_5)_2$, P$(C_3H_7)_2$, P(i-$C_3H_7)_2$, P(n-$C_4H_9)_2$, P(t-$C_4H_9)_2$, and most preferably selected from the group consisting of H, $CH_3$, $C_2H_5$, $C_3H_7$, i-$C_3H_7$, $C_4H_9$, t-$C_4H_9$, N$(CH_3)_2$, N$(C_2H_5)_2$, N$(CH_3)(C_2H_5)$, N$(CH_3)$ $(C_3H_7)$, N$(C_3H_7)_2$, N(i-$C_3H_7)_2$, N$(CH_3)$(i-$C_3H_7)$, N$(CH_3)$ (n-$C_4H_9)$ N(n-$C_4H_9)_2$, N(t-$C_4H_9)_2$, N$(CH_3)$(t-$C_4H_9)$, N$(C_2H_5)(C_3H_7)$, N$(C_2H_5)$(i-$C_3H_7)$, N$(C_2H_5)$(n-$C_4H_9)$, N$(C_2H_5)$(t-$C_4H_9)$, N$(C_3H_7)$(i-$C_3H_7)$, N$(C_3H_7)$(n-$C_4H_9)$, N$(C_3H_7)$(t-$C_4H_9)$, N(n-$C_4H_9)$(t-$C_4H_9)$.

In Formula (3) or (4), $R_1$ is selected from $C_1$-$C_6$ alkyl, $C_1$-$C_6$ fluoroalkyl or OR", preferably a $C_1$-$C_4$ alkyl group, a $C_1$-$C_4$ fluoroalkyl group, and most preferably selected from $CH_3$, $C_2H_5$, $C_3H_7$, i-$C_3H_7$, n-$C_4H_9$, t-$C_4H_9$. R' is selected from R", OR", NR"$_2$, SiR"$_3$, PR"$_2$, preferably selected from the group consisting of H, $CH_3$, $C_2H_5$, $C_3H_7$, i-$C_3H_7$, $C_4H_9$, t-$C_4H_9$, N$(CH_3)_2$, N$(C_2H_5)_2$, N$(CH_3)(C_2H_5)$, N$(CH_3)$ $(C_3H_7)$, N$(C_3H_7)_2$, N(i-$C_3H_7)_2$, N$(CH_3)$(i-$C_3H_7)$, N$(CH_3)$ (n-$C_4H_9)$, N(n-$C_4H_9)_2$, N(t-$C_4H_9)_2$, N$(CH_3)$(t-$C_4H_9)$, N$(C_2H_5)(C_3H_7)$, N$(C_2H_5)$(i-$C_3H_7)$, N$(C_2H_5)$(n-$C_4H_9)$, N$(C_2H_5)$(t-$C_4H_9)$, N$(C_3H_7)$(i-$C_3H_7)$, N$(C_3H_7)$(n-$C_4H_9)$, N$(C_3H_7)$(t-$C_4H_9)$, N(n-$C_4H_9)$(t-$C_4H_9)$, Si$(CH_3)_3$, Si$(C_2H_5)_3$, Si$(C_3H_7)_3$, Si(i-$C_3H_7)_3$, Si(n-$C_4H_9)_3$, Si(t-$C_4H_9)_3$, P$(CH_3)_2$, P$(C_2H_5)_2$, P$(C_3H_7)_2$, P(i-$C_3H_7)_2$, P(n-$C_4H_9)_2$, P(t-$C_4H_9)_2$, and most preferably selected from the group consisting of H, $CH_3$, $C_2H_5$, $C_3H_7$, i-$C_3H_7$, $C_4H_9$, t-$C_4H_9$, N$(CH_3)_2$, N$(C_2H_5)_2$, N$(CH_3)(C_2H_5)$, N$(CH_3)$ $(C_3H_7)$, N$(C_3H_7)_2$, N(i-$C_3H_7)_2$, N$(CH_3)$(i-$C_3H_7)$, N$(CH_3)$ (n-$C_4H_9)$, N(n-$C_4H_9)_2$, N(t-$C_4H_9)_2$, N$(CH_3)$(t-$C_4H_9)$, N$(C_2H_5)(C_3H_7)$, N$(C_2H_5)$(i-$C_3H_7)$, N$(C_2H_5)$(n-$C_4H_9)$, N$(C_2H_5)$(t-$C_4H_9)$, N$(C_3H_7)$(i-$C_3H_7)$, N$(C_3H_7)$(n-$C_4H_9)$, N$(C_3H_7)$(t-$C_4H_9)$, N(n-$C_4H_9)$(t-$C_4H_9)$. $R_3$ is preferably halogen, more preferably Cl, Br, or I.

Hereinafter, synthesis examples of the compound represented by Formula (1) comprised in the precursor of the present invention and formation production examples of the film using the same will be specifically described, but the present invention is not limited to these examples.

[Synthesis of Tungsten Precursor Compound]

EXAMPLE 1 bis-cyclopentadienyl-bis-(n-butylimido) tungsten (VI)

In a round bottom flask with nitrogen atmosphere, 10 g (25.2 mmol) of $WCl_6$ and 16.5 g (113.5 mmol) of n-butyl-trimethylsilylamine were reacted in 100 mL of anhydrous THF for 24 hours to obtain a yellow solid. 10 mL of pyridine was added to the yellow solid, and the mixture was stirred for 2 hours to obtain a green solid. 0.5 g (0.9 mmol) of the tungsten compound is mixed with 0.5 g (6.3 mmol) of pyridine. To the mixed solution of tungsten compound and pyridine at −50° C., 0.9 mL (2M solution of THF, 1.8 mmol) of sodium cyclopentadiene was added and the reaction was carried out for 24 hours. Then, THF and pyridine were evaporated under vacuum and filtered through celite to obtain yellow liquid 0.29 g (71% yield).

EXAMPLE 2

Bis-cyclopentadienyl-bis-(t-butylimido) tungsten (VI)

In a round bottom flask with nitrogen atmosphere, 10 g (25.2 mmol) of $WCl_6$ and 16.5 g (113.5 mmol) of t-butylt-rimethylsilylamine were reacted in 100 mL of anhydrous THF for 24 hours to obtain a yellow solid. The reaction was then carried out in the same manner as in Example 1 above. (73% yield)

EXAMPLE 3

Bis-methylcyclopentadienyl-bis-(t-butylimido) tungsten (VI)

In a round bottom flask with nitrogen atmosphere, 10 g (25.2 mmol) of $WCl_6$ and 16.5 g (113.5 mmol) of t-butylt-rimethylsilylamine were reacted in 100 mL of anhydrous THF for 24 hours to obtain a yellow solid. To the yellow solid was added 10 mL of pyridine and the mixture was stirred for 2 hours to obtain a green solid. 0.5 g (0.9 mmol) of the tungsten compound is mixed with 0.5 g (6.3 mmol) of pyridine. After 0.18 g (1.8 mmol) of sodium methylcyclopentadiene was added to the mixed solution of tungsten compound and pyridine at −50° C., reaction was carried out for 24 hours, then THF and pyridine were evaporated under vacuum and filtered through celite to obtain yellow liquid 0.31 g (70% yield).

EXAMPLE 4

Chlorocycloheptatrienyl-bis (t-butylimido) tungsten (VI)

In a round bottom flask with nitrogen atmosphere, 10 g (25.2 mmol) of $WCl_6$ and 16.5 g (113.5 mmol) of t-butylt-rimethylsilylamine were reacted in 100 mL of anhydrous THF for 24 hours to obtain a yellow solid. To the yellow solid was added 10 mL of pyridine and the mixture was stirred for 2 hours to obtain a green solid. 0.5 g (0.9 mmol) of the tungsten compound is mixed with 0.5 g (6.3 mmol) of pyridine. 0.1 g (0.9 mmole) of sodium cycloheptatriene was added to a mixed solution of tungsten compound and pyridine at −50° C. and reacted for 24 hours. Then, THF and pyridine were evaporated under vacuum and filtered through celite to obtain yellow liquid 0.25 g (60% yield).

Although exemplary embodiments of the present invention have been described for illustrative purposes, those skilled in the art will appreciate that various modifications, additions and substitutions are possible, without departing from the scope and spirit of the invention as disclosed in the accompanying claims. Therefore, the embodiment disclosed in the present invention is intended to illustrate the scope of the technical idea of the present invention, and the scope of the present invention is not limited by the embodiment. The scope of the present invention shall be construed on the basis of the accompanying claims, and it shall be construed that all of the technical ideas included within the scope equivalent to the claims belong to the present invention.

What is claimed is:

1. A tungsten precursor compound represented by Formula (2):

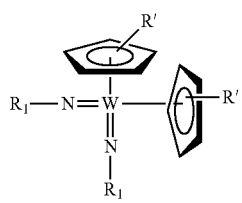

<Formula (2)> wherein
$R_1$ is selected from the group consisting of $C_1$-$C_6$ alkyl; $C_1$-$C_6$ fluoroalkyl; and OR",
R' is selected from the group consisting of R"; OR"; NR"$_2$; SiR"$_3$; and PR"$_2$; and
R" is selected from the group consisting of H; $CH_3$; $C_2H_5$; $C_3H_7$; i-$C_3H_7$; n-$C_4H_9$; and t-$C_4H_9$.

2. The tungsten precursor compound of claim 1,
wherein $R_1$ is selected from the group consisting of $CH_3$; $C_2H_5$; $C_3H_7$; i-$C_3H_7$; n-$C_4H_9$; and t-$C_4H_9$, and
R' is selected from the group consisting of H; $CH_3$; $C_2H_5$; OH; $OCH_3$; $OC_2H_5$; $N(CH_3)_2$; $N(C_2H_5)_2$; $N(CH_3)(C_2H_5)$; SiR"$_3$; and PR"$_2$.

3. The tungsten precursor compound of claim 1,
wherein $R_1$ is n-$C_4H_9$ or t-$C_4H_9$,
R' is selected from the group consisting of H; $CH_3$; $C_2H_5$; $OCH_3$; $OC_2H_5$; $N(CH_3)_2$; $N(C_2H_5)_2$; $N(CH_3)(C_2H_5)$; SiR"$_3$; and PR"$_2$.

4. A method of forming a tungsten thin film using a tungsten precursor compound according to claim 1.

5. The method of claim 4,
wherein the thin film formation is carried out by chemical vapor deposition (CVD) or atomic layer deposition (ALD).

6. A tungsten precursor compound represented by Formula (3):

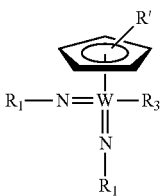

<Formula (3)> wherein
$R_1$ is selected from the group consisting of $C_1$-$C_6$ alkyl; $C_1$-$C_6$ fluoroalkyl; and OR",
$R_3$ is halogen,
R' is selected from the group consisting of R"; OR"; NR"$_2$; SiR"$_3$; and PR"$_2$; and
R" is selected from the group consisting of H; $CH_3$; $C_2H_5$; $C_3H_7$; i-$C_3H_7$; n-$C_4H_9$; and t-$C_4H_9$.

7. The tungsten precursor compound of claim 6,
wherein R' is selected from the group consisting of H; $CH_3$; $C_2H_5$; OH; $OCH_3$; $OC_2H_5$; $N(CH_3)_2$; $N(C_2H_5)_2$; $N(CH_3)(C_2H_5)$; SiR"$_3$; and PR"$_2$.

8. The tungsten precursor compound of claim 6,
wherein $R_1$ is n-$C_4H_9$ or t-$C_4H_9$,
R' is selected from the group consisting of H; $CH_3$; $C_2H_5$; $OCH_3$; $OC_2H_5$; $N(CH_3)_2$; $N(C_2H_5)_2$; $N(CH_3)(C_2H_5)$; SiR"$_3$; and PR"$_2$, and $R_3$ is Cl.

9. A tungsten precursor compound represented by Formula (4):

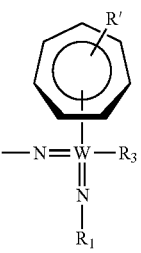

<Formula (4)> wherein
$R_1$ is selected from the group consisting of $C_1$-$C_6$ alkyl; $C_1$-$C_6$ fluoroalkyl; and OR",
R' is selected from the group consisting of R"; OR"; NR"$_2$; SiR"$_3$; and PR"$_2$; and
R" is selected from the group consisting of H; $CH_3$; $C_2H_5$; $C_3H_7$; i-$C_3H_7$; n-$C_4H_9$; and t-$C_4H_9$, and
$R_3$ is halogen.

10. The tungsten precursor compound of claim 9,
wherein R' is selected from the group consisting of H; $CH_3$; $C_2H_5$; OH; $OCH_3$; $OC_2H_5$; $N(CH_3)_2$; $N(C_2H_5)_2$; $N(CH_3)(C_2H_5)$; SiR"$_3$; and PR"$_2$.

11. The tungsten precursor compound of claim 9,
wherein $R_1$ is n-$C_4H_9$ or t-$C_4H_9$,
R' is selected from the group consisting of H; $CH_3$; $C_2H_5$; $OCH_3$; $OC_2H_5$; $N(CH_3)_2$; $N(C_2H_5)_2$; $N(CH_3)(C_2H_5)$; SiR"$_3$; and PR"$_2$, and
$R_3$ is Cl.

* * * * *